United States Patent
Her

(10) Patent No.: US 7,725,785 B2
(45) Date of Patent: May 25, 2010

(54) FILM-TYPE SEMICONDUCTOR PACKAGE AND METHOD USING TEST PADS SHARED BY OUTPUT CHANNELS, AND TEST DEVICE, SEMICONDUCTOR DEVICE AND METHOD USING PATTERNS SHARED BY TEST CHANNELS

(75) Inventor: Nam-jung Her, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 595 days.

(21) Appl. No.: 11/602,749

(22) Filed: Nov. 21, 2006

(65) Prior Publication Data

US 2007/0226569 A1    Sep. 27, 2007

(30) Foreign Application Priority Data

Nov. 28, 2005  (KR) ................ 10-2005-0114370

(51) Int. Cl.
*G01R 31/28*  (2006.01)
*G01R 31/02*  (2006.01)
*G01R 31/26*  (2006.01)

(52) U.S. Cl. ................ 714/724; 714/734; 324/763; 324/765

(58) Field of Classification Search ................ None
See application file for complete search history.

(56) References Cited

U.S. PATENT DOCUMENTS

| 5,386,127 | A | 1/1995 | Furuyama |
| 6,185,708 | B1 * | 2/2001 | Sugamori ................ 714/724 |
| 6,252,416 | B1 * | 6/2001 | Lim ................ 324/765 |
| 6,356,490 | B1 * | 3/2002 | Matsuo et al. ................ 365/201 |
| 7,301,357 | B2 * | 11/2007 | Shinozaki et al. ........... 324/757 |
| 2006/0061374 | A1 | 3/2006 | Shinozaki et al. |

FOREIGN PATENT DOCUMENTS

| EP | 1574866 A1 | 9/2005 |
| JP | 2004-095756 | 3/2004 |
| KR | 1996-0004460 | 4/1996 |
| KR | 1999-025829 | 6/1999 |
| KR | 2000-0071264 | 11/2000 |
| KR | 10-0439128 | 6/2004 |

OTHER PUBLICATIONS

Preliminary Notice of the First Office Action from the Taiwanese Patent Office, dated Feb. 6, 2010, issued in corresponding International Application No. TW095142762.

* cited by examiner

*Primary Examiner*—Christine T Tu
(74) *Attorney, Agent, or Firm*—Mills & Onello, LLP

(57) ABSTRACT

Provided are a film-type semiconductor package and method using test pads shared by output channels, a test device, and a semiconductor device and method using patterns shared by test channels. The semiconductor device includes a film-type semiconductor package and a test device. The film-type semiconductor package outputs test signals through a plurality of test pads. The test device tests the film-type semiconductor package using the test signals. A printed circuit board (PCB) of the test device includes a plurality of common patterns, each of which connects at least two of a plurality of test channels to an input terminal, the test channels connecting the input terminals to the test pins. When the film-type semiconductor package, the method of testing the semiconductor package, the semiconductor device and the test device, and the method of testing the film-type semiconductor package in the semiconductor device are used, the film-type semiconductor package can be tested without replacing an existing test device.

10 Claims, 17 Drawing Sheets

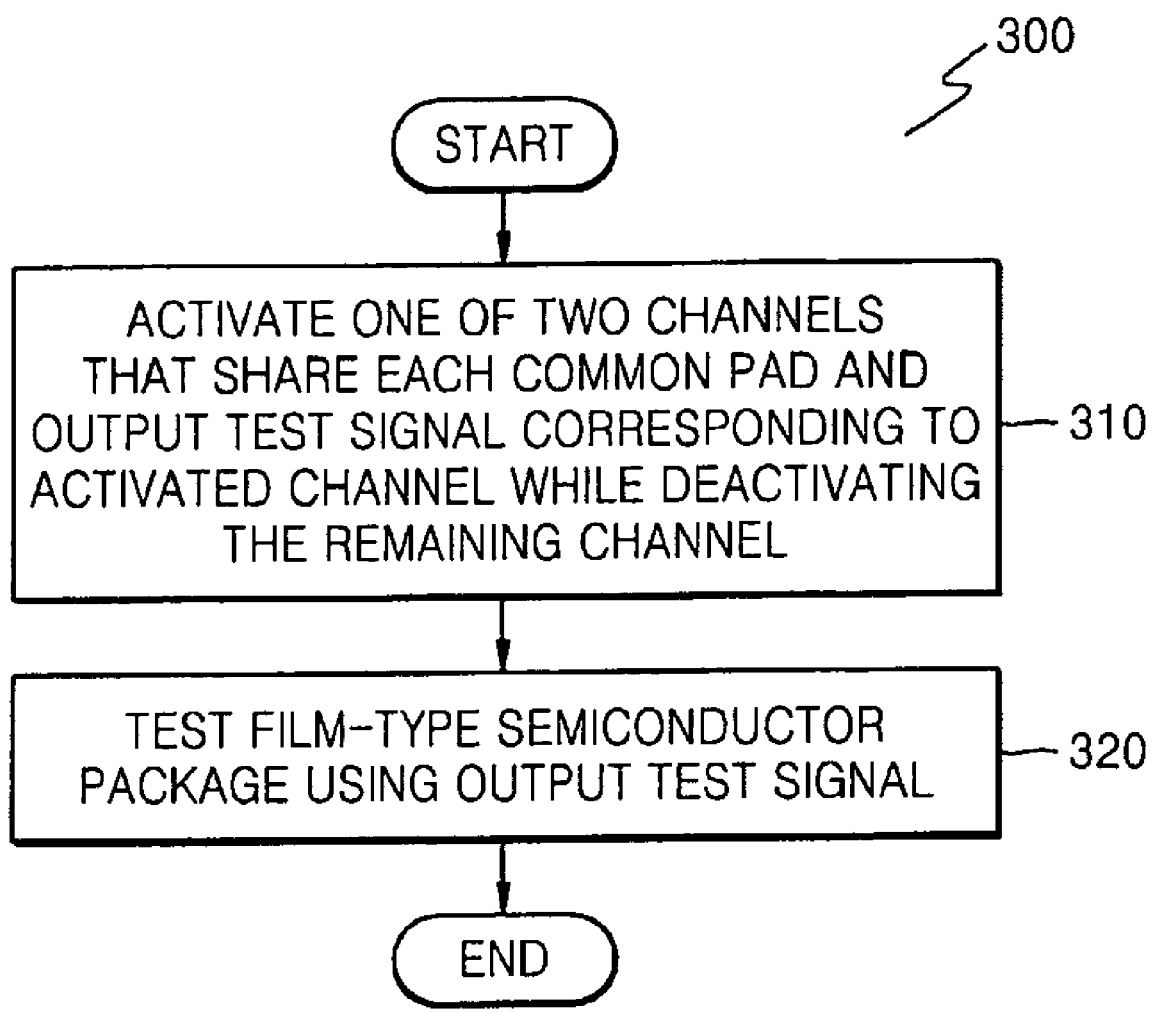

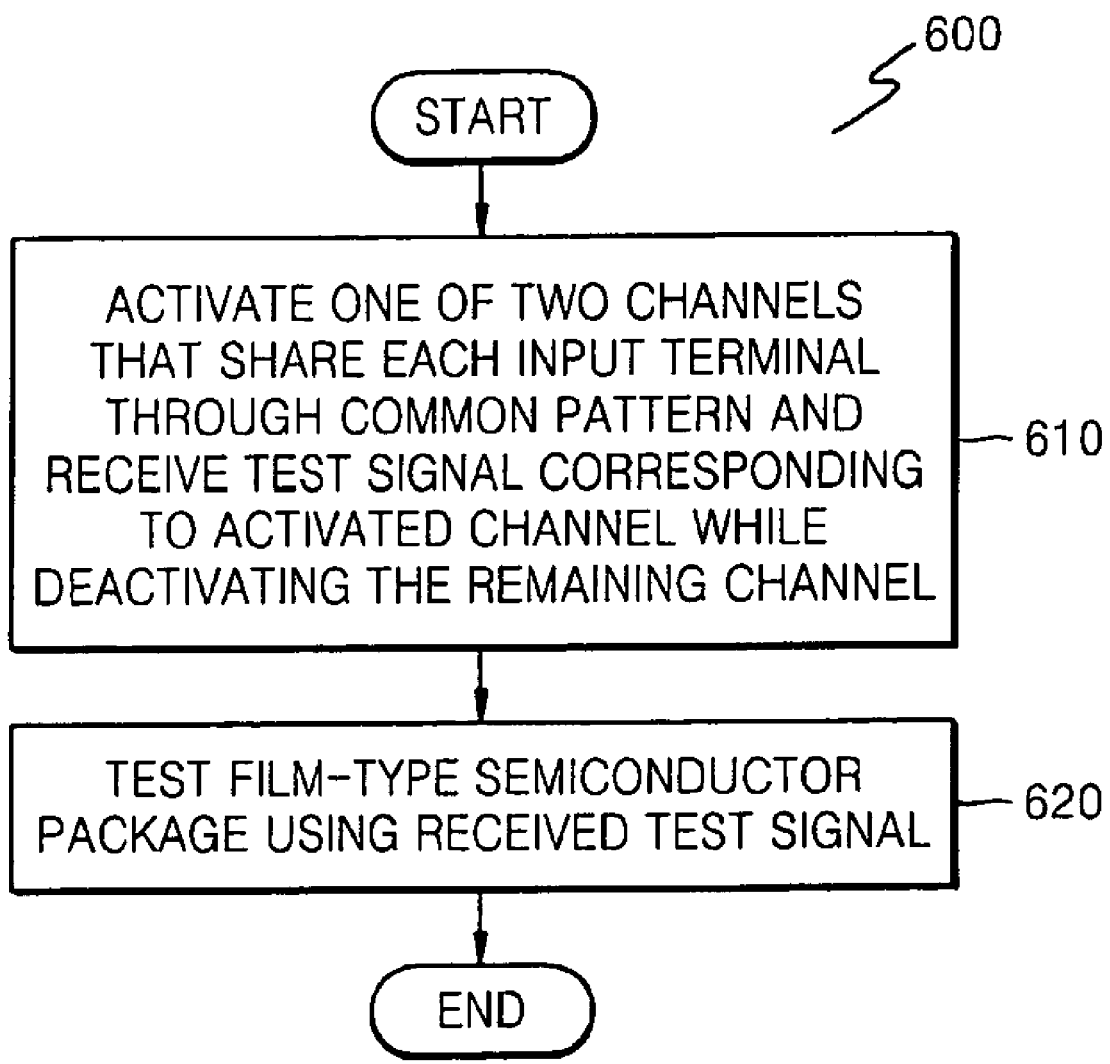

FILM-TYPE SEMICONDUCTOR PACKAGE AND METHOD USING TEST PADS SHARED BY OUTPUT CHANNELS, AND TEST DEVICE, SEMICONDUCTOR DEVICE AND METHOD USING PATTERNS SHARED BY TEST CHANNELS

This application claims the priority of Korean Patent Application No. 10-2005-0114370, filed on Nov. 28, 2005, in the Korean Intellectual Property Office, the contents of which are incorporated herein in their entirety by reference.

BACKGROUND OF THE INVENTION

1. Field of the Invention

The present invention relates to a semiconductor device, and more particularly, to a film-type semiconductor package and method using test pads shared by output channels, a test device, and a semiconductor device and method using patterns shared by test channels.

2. Description of the Related Art

A film-type semiconductor package, such as a chip-on-film (COF), transmits a signal generated by a display driver to a display panel.

Film-type semiconductor packages are tested at multiple stages of a manufacturing process. In particular, after film-type semiconductor packages are manufactured, the film-type semiconductor packages are tested for contact. In this case, test signals are transmitted to the film-type semiconductor packages, and signals output from output pins of the film-type semiconductor packages are checked. Is determined whether the test signals transmitted to the film-type semiconductor packages are identical to the signals output therefrom.

FIG. 1 illustrates test pads TPAD of a conventional film-type semiconductor package 10. FIG. 2 illustrates output channels CH respectively connecting the test pads TPAD to output pins OPIN of the film-type semiconductor package 10 of FIG. 1.

Referring to FIGS. 1 and 2, the conventional film-type semiconductor package 10 includes the output pins OPIN, buffers BUF, the output channels CH, and the test pads TPAD. The buffers BUF receive test signals to be subsequently output therefrom. The output pins OPIN transmit the received test signals to the test pads TPAD.

The test signals are transmitted through the output channels CH, which connect the output pins OPIN and the test pads TPAD. There is a one-to-one correspondence between the output pins OPIN and the test pads TPAD. Therefore, the number of test pads TPAD is identical to the number of output pins OPIN.

The test pads TPAD transmit the test signals to a test device (not shown) through the output channels CH respectively connected thereto. The test device (not shown) tests the film-type semiconductor package 10 using the received test signals.

FIG. 3 illustrates a conventional test device 30. Referring to FIG. 3, the conventional test device 30 includes test pins TPIN, a printed circuit board (PCB) 32, and a tester head 34. A film-type semiconductor package 40 of FIG. 3 is analogous to the film-type semiconductor package 10 of FIG. 1.

The test pins TPIN are connected to the test pads TPAD of the film-type semiconductor package 40, and thus receive test signals. The tester head 34 receives the test signals through input terminals ITERM and tests the film-type semiconductor package 40.

The PCB 32 of the conventional test device 30 includes patterns PAT for transmitting the test signals received by the test pins TPIN to the tester head 34. The patterns PAT are formed by patterning test channels CH which connect the test pins TPIN to the input terminals ITERM, respectively.

To test the conventional film-type semiconductor package 10 or 40 using the conventional test device 30, the number of test pins TPIN and the number of input terminals ITERM included in the conventional test device 30 must be equal to or greater than the number of the output pins OPIN of the film-type semiconductor package 10 or 40 because the number of test pads TPAD included in the conventional film-type semiconductor package 10 or 40 must be equal to the number of output pins OPIN, and the test pins TPIN and the input terminals ITERM of the conventional test device 30 must respectively correspond to the test pads TPAD.

Therefore, when the number of output pins OPIN of the film-type semiconductor package 10 or 40 is greater than the number of test pins TPIN and the input terminals ITERM of the conventional test device 30, the conventional test device 30 cannot test the film-type semiconductor package 10 or 40. That is, an increase in the number of output pins OPIN included in the film-type semiconductor package 10 or 40 requires the costly replacement of the test device 30.

Furthermore, growing demand for larger and higher visual-quality liquid crystal displays (LCDs) has resulted in a rapid increase in the number of output pins OPIN of the film-type semiconductor package 10 or 40. Consequently, the test device 40 must be more frequently replaced at high costs.

SUMMARY OF THE INVENTION

The present invention provides a film-type semiconductor package including test pads shared by output channels such that an existing test device can test the film-type semiconductor package even when the number of output pins of the film-type semiconductor package increases.

The present invention also provides a method of testing a film-type semiconductor package including test pads shared by output channels such that an existing test device can test the film-type semiconductor package even when the number of output pins of the film-type semiconductor package increases.

The present invention also provides a semiconductor device including patterns shared by test channels such that an existing test device can test a film-type semiconductor package even when the number of output pins of the film-type semiconductor package increases.

The present invention also provides a method of testing a film-type semiconductor package in a semiconductor device including patterns shared by test channels such that an existing test device can test the film-type semiconductor package even when the number of output pins of the film-type semiconductor package increases.

According to an aspect of the present invention, there is provided a film-type semiconductor package including an output unit outputting test signals through a plurality of output channels; and a test pad unit receiving the test signals and transmitting the received test signals to an external device. The test pad unit includes a plurality of common pads, each of which is shared by at least two of the output channels.

In one embodiment, the test pad unit transmits the test signals to an external test device. The output unit includes a plurality of switches respectively activating the output channels.

Two of the output channels can share each of the common pads. In one embodiment, when a group of the output channels arranged in order are from first to $n^{th}$ (n is a multiple of 2) output channels, each of the common pads is shared by an $i^{th}$ channel and a $j^{th}$ channel (i and j are natural numbers equal to or smaller than n), where i+j=n+1.

In one embodiment, the test pad unit further includes a plurality of normal pads respectively connected to the output channels which do not share the common pads one-to-one. In one embodiment, when a group of the output channels arranged in order are from first to $n^{th}$ (n is a multiple of 2) output channels, each of the common pads is shared by an $i^{th}$ channel and a $j^{th}$ channel (i and j are natural numbers equal to or smaller than n), where i+j=n+1, and each of the normal pads respectively connect a n/2-th output channel and a ((n/2)+1)-th output channel.

According to another aspect of the present invention, there is provided a method of testing a film-type semiconductor package comprising a plurality of common pads, each of which is shared by at least two output channels which transmit test signals to an external device, the method including activating one of the at least two output channels which share each of the common pads and outputting a test signal corresponding to the activated output channel while deactivating the remaining output channels; and testing the film-type semiconductor package using the output test signals.

In one embodiment, the film-type semiconductor package includes a plurality of switches respectively activating the output channels. Two of the output channels can share each of the common pads.

According to another aspect of the present invention, there is provided a test device including a plurality of test pins receiving test signals; a tester head receiving the test signals through a plurality of input terminals and conducting a test; and a printed circuit board (PCB) receiving the test signals from the test pins and transmitting the received test signals to the tester head. The PCB comprises a plurality of common patterns, each of which connects at least two test channels to an input terminal, the test channels connecting the input terminals to the test pins.

In one embodiment, each of the common patterns is patterned such that the at least two test channels share one of the input terminals. The at least two test channels can be adjacent to each other. The at least two test channels can be odd numbered test channels or even numbered test channels adjacent to each other.

In one embodiment, when the PCB has a plurality of layers, the common patterns are patterned such that the test channels in a different given layer of the PCB share one of the input terminals.

According to another aspect of the present invention, there is provided a semiconductor device including a film-type semiconductor package outputting test signals through a plurality of test pads; and a test device testing the film-type semiconductor package using the test signals. The test device includes a plurality of test pins receiving the test signals; a tester head receiving the test signals through a plurality of input terminals and conducting a test; and a PCB receiving the test signals from the test pins and transmitting the received test signals to the tester head. The PCB comprises a plurality of common patterns, each of which connects at least two test channels to an input terminal, the test channels connecting the input terminals to the test pins.

In one embodiment, one of the at least two test channels which share each of the input terminals is activated and outputs a corresponding test signal while the remaining output channels are deactivated. The at least two test channels which share each input terminal can be sequentially activated. The film-type semiconductor package can includes a plurality of switches respectively activating the test channels.

In one embodiment, each of the common patterns is patterned such that the at least two test channels share one of the input terminals. in one embodiment, when the PCB has a plurality of layers, the common patterns are patterned such that the test channels in a different given layer of the PCB share one of the input terminals.

According to another aspect of the present invention, there is provided a method of testing a film-type semiconductor package in a semiconductor device which includes the film-type semiconductor package and a test device including a plurality of common patterns, each of which connects at least two test channels receiving the test signals from the film-type semiconductor package to an input terminal, the method including activating one of the at least two test channels which are connected to each of the input terminals and receiving a test signal corresponding to the activated test channel while deactivating the remaining test channels; and testing the film-type semiconductor package using the received test signal.

in one embodiment, each of the common patterns is patterned such that the at least two test channels share one of the input terminals. The film-type semiconductor package can include a plurality of switches respectively activating the output channels. The common patterns can be patterned such that, when a PCB has a plurality of layers, the test channels in different layers of the PCB share one of the input terminals.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIG. 9 is a flowchart illustrating a method of testing a film-type semiconductor according to an embodiment of the present invention.

FIG. 14 is a flowchart illustrating a method of testing a film-type semiconductor package in a semiconductor device according to an embodiment of the present invention.

DETAILED DESCRIPTION OF THE INVENTION

Figure 1:
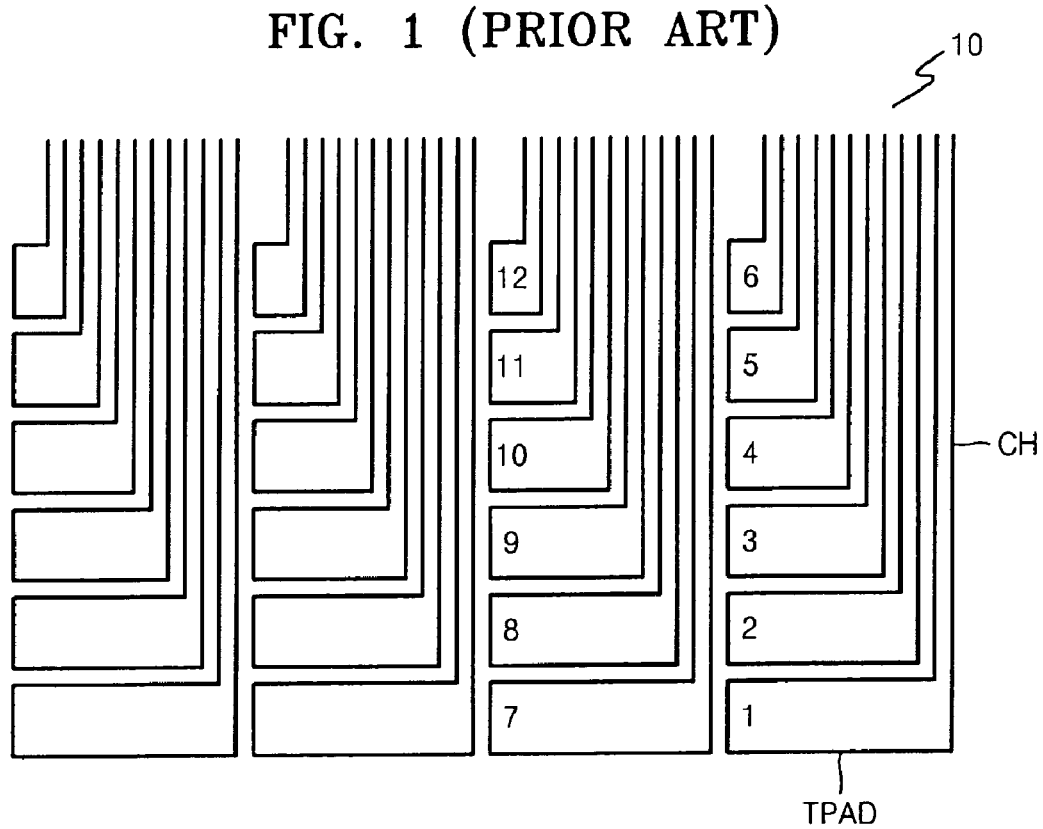
FIG. 1 illustrates test pads of a conventional film-type semiconductor package.
Figure 2:
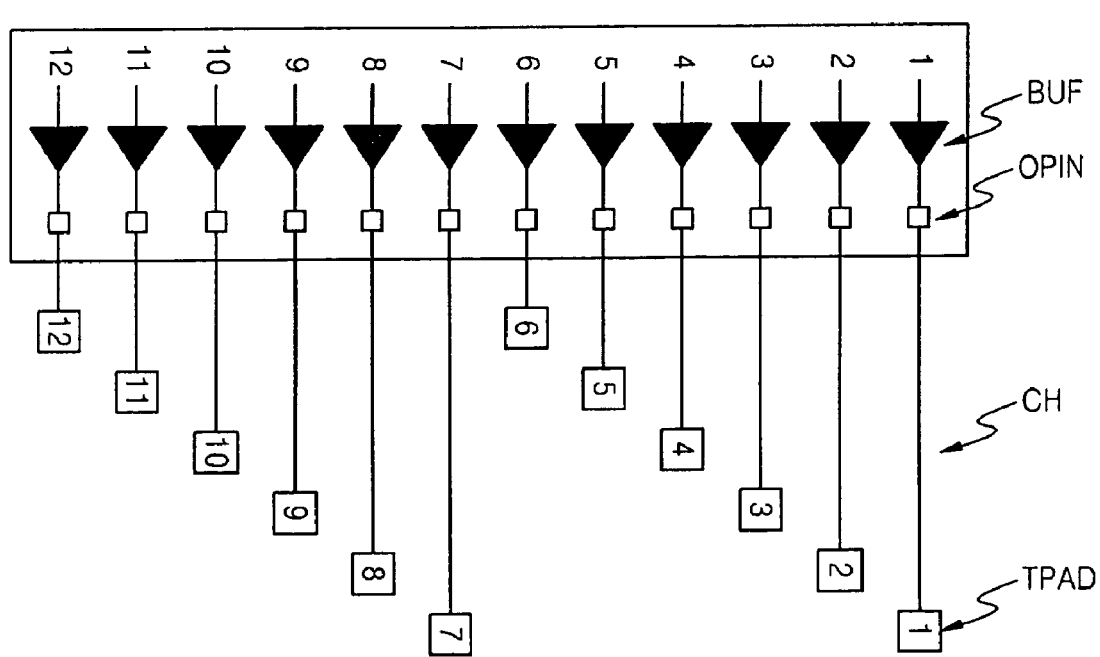
FIG. 2 illustrates output channels respectively connecting test pads to output pins of the film-type semiconductor package of FIG. 1.
Figure 3:
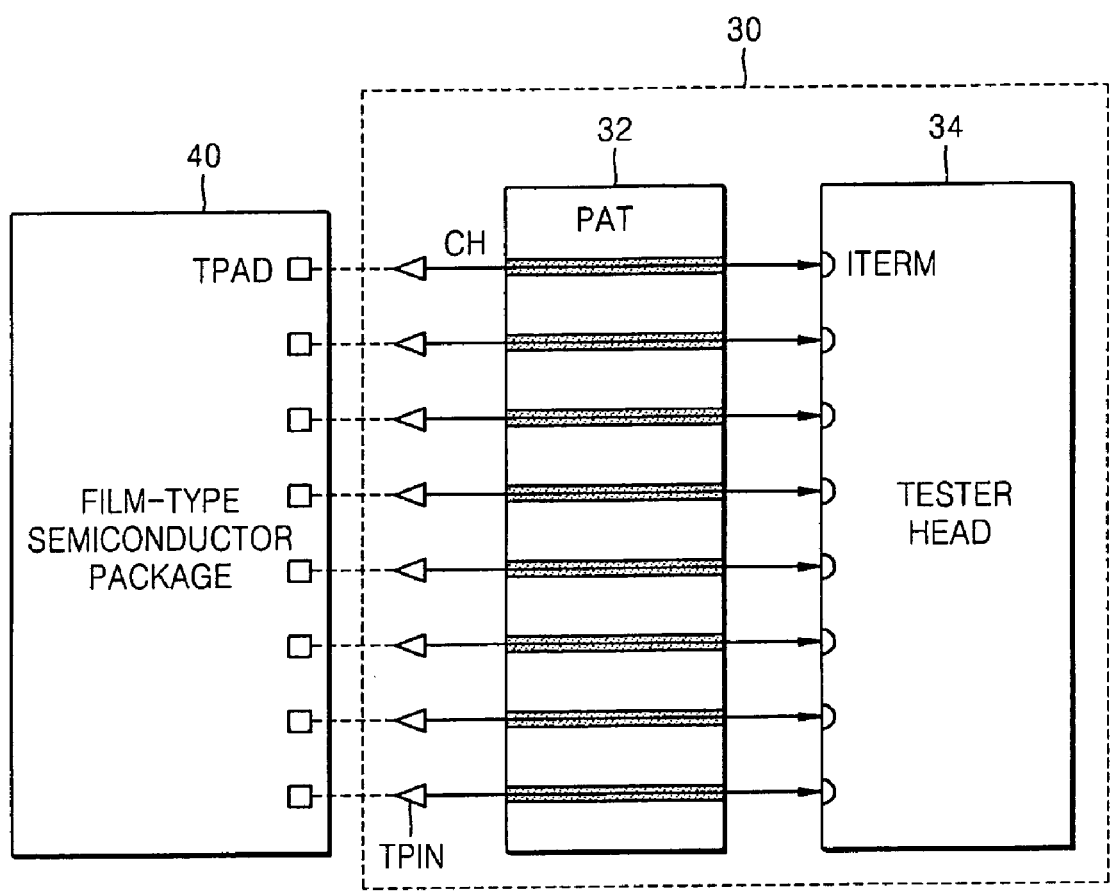
FIG. 3 is a block diagram of a conventional test device.
Figure 4:
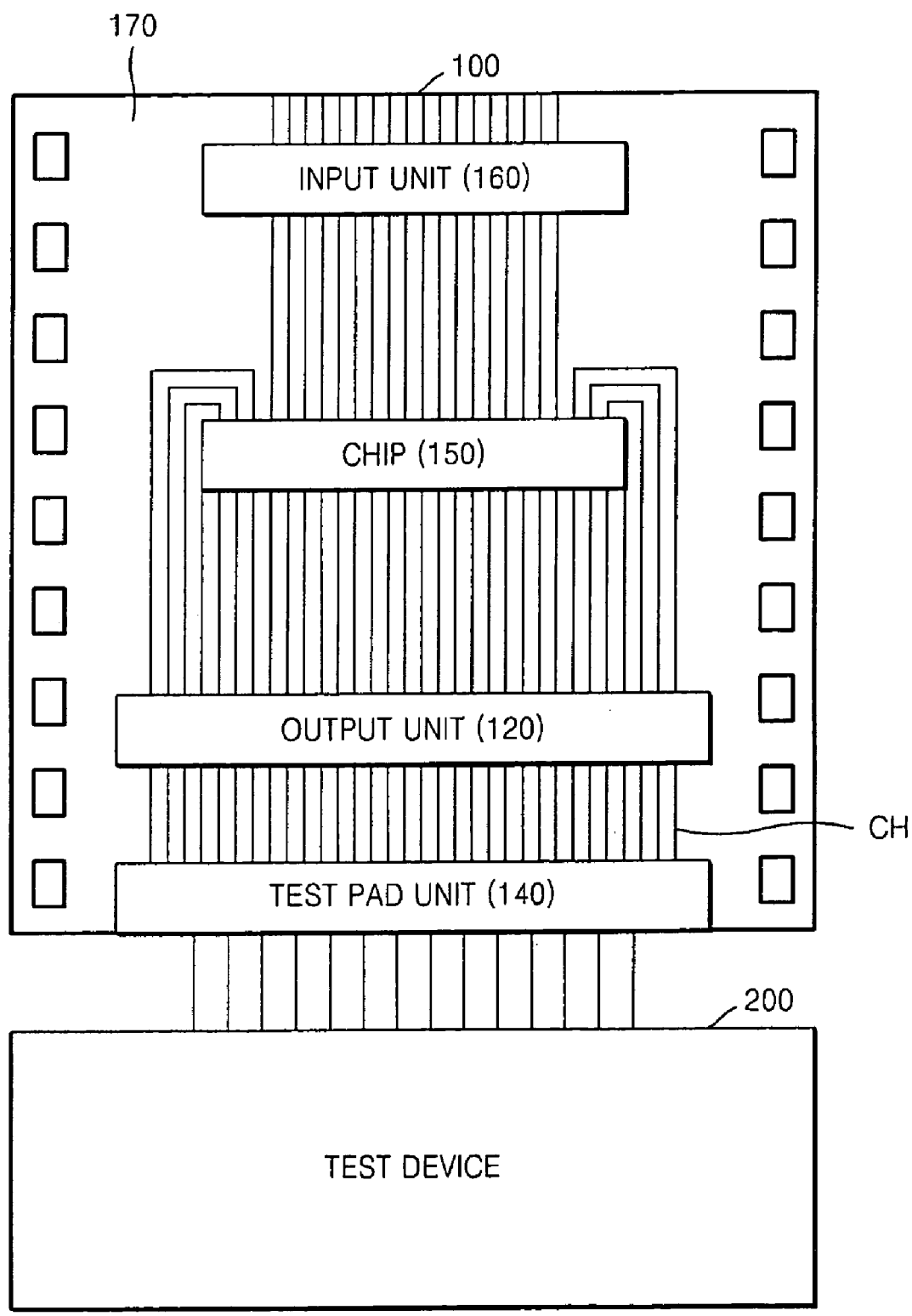
FIG. 4 is a block diagram of a film-type semiconductor package according to an embodiment of the present invention.

FIG. 4 is a block diagram a film-type semiconductor package 100 according to an embodiment of the present invention. Referring to FIG. 4, the film-type semiconductor package 100 includes an output unit 120 and a test pad unit 140. The output unit 120 outputs test signals through output channels CH. The test pad unit 140 receives the test signals and transmits the test signals to an external device 200.

The test pad unit 140 includes a plurality of common pads (not shown), each shared by at least two of the output channels CH. The test pad unit 140 may transmit the test signals to an external test device 200. Two of the output channels CH can share the common pads (not shown).

Figure 5:
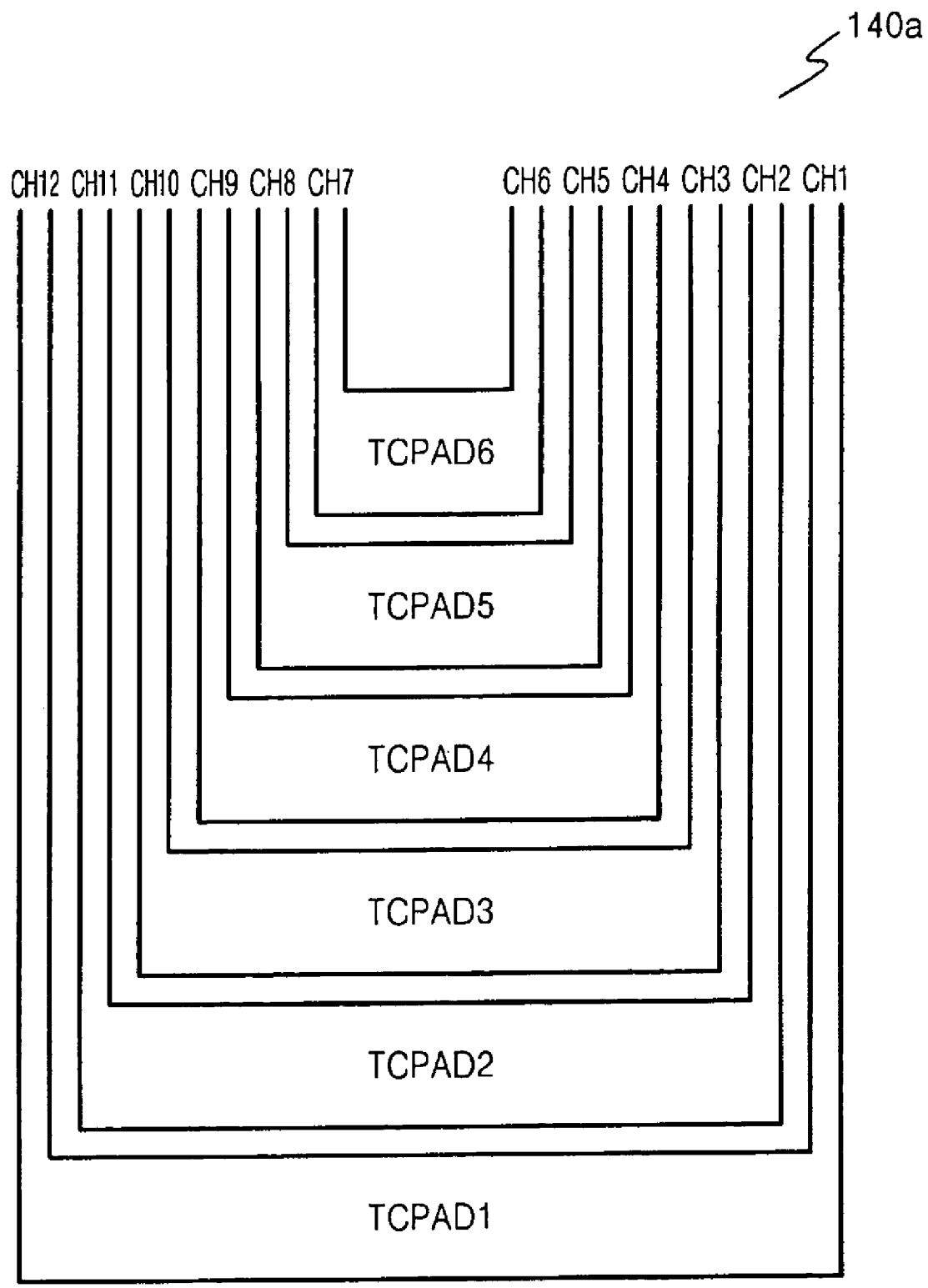
FIG. 5 illustrates part of a test pad unit illustrated in FIG. 4.

FIG. 5 illustrates part of the test pad unit 140 illustrated in FIG. 4. Referring to FIG. 5, a test pad unit 140a includes n/2 (n is a multiple of 2) common pads TCPAD1 through TCPADk (k is a natural number smaller than n). Although the common pads TCPAD1 through TCPADk can be the same size, the common pads TCPAD1 through TCPADk are illustrated in FIG. 5 with different sizes for easier depiction. The test pad unit 140a illustrated in FIG. 5 is configured for twelve (n=12) output channels.

Each of the common pads TCPAD1 through TCPADk is shared by a pair of corresponding output channels CHi and CHj (i and j are natural numbers smaller than n) among n output channels CH1 through CHn sequentially disposed. For the output channels CHi and CHj that share one of the common pads TCPAD1 through TCPADk, i+j=n+1.

That is, when the n output channels CH1 through CHn form a unit, the outermost output channels among the n output channels CH1 through CHn share the common pad TCPAD1. The second outermost output channels among the n output channels CH1 through CHn share the common pad TCPAD2. In a similar manner, the central output channels CHn/2 and CHn/2+1 share the common pad TCPADk.

For example, when 12 (n=12) output channels CH1 through CH12 form one unit as illustrated in FIG. 5, output channels CHi and CHj(1+j=n+1=13) share one of the common pads TCPAD1 through TCPAD6. That is, first and twelfth output channels CH1 and CH12 share a first common pad TCPAD1, and second and eleventh output channels CH2 and CH11 share a second common pad TCPAD2. Similarly, third and tenth output channels CH3 and CH10, fourth and ninth output channels CH4 and CH9, fifth and the eighth output channels CH5 and CH8, and sixth and seventh output channels CH6 and CH7 respectively share third, fourth, fifth and sixth common pads TCPAD3, TCPAD4, TCPAD5 and TCPAD6.

In the above example, the test pad unit 140a includes the 6 (n/2=6) common pads TCPAD1 through TCPAD6 corresponding to the twelve output channels CH1 through CH12. However, the test pad unit 140a may include as many common pads TCPAD1 through TCPADk as needed.

For example, if the film-type semiconductor package 100 includes 100 output channels and the test device 200 includes 75 test pins, it is not necessary to have 50 common pads. In the above example, the test pad unit 140a may include 25 common pads and 25 normal test pads that are not shared by output channels.

When the film-type semiconductor package 100 includes n×m output channels CH, it may include m test pad units 140a.

Figure 6A:
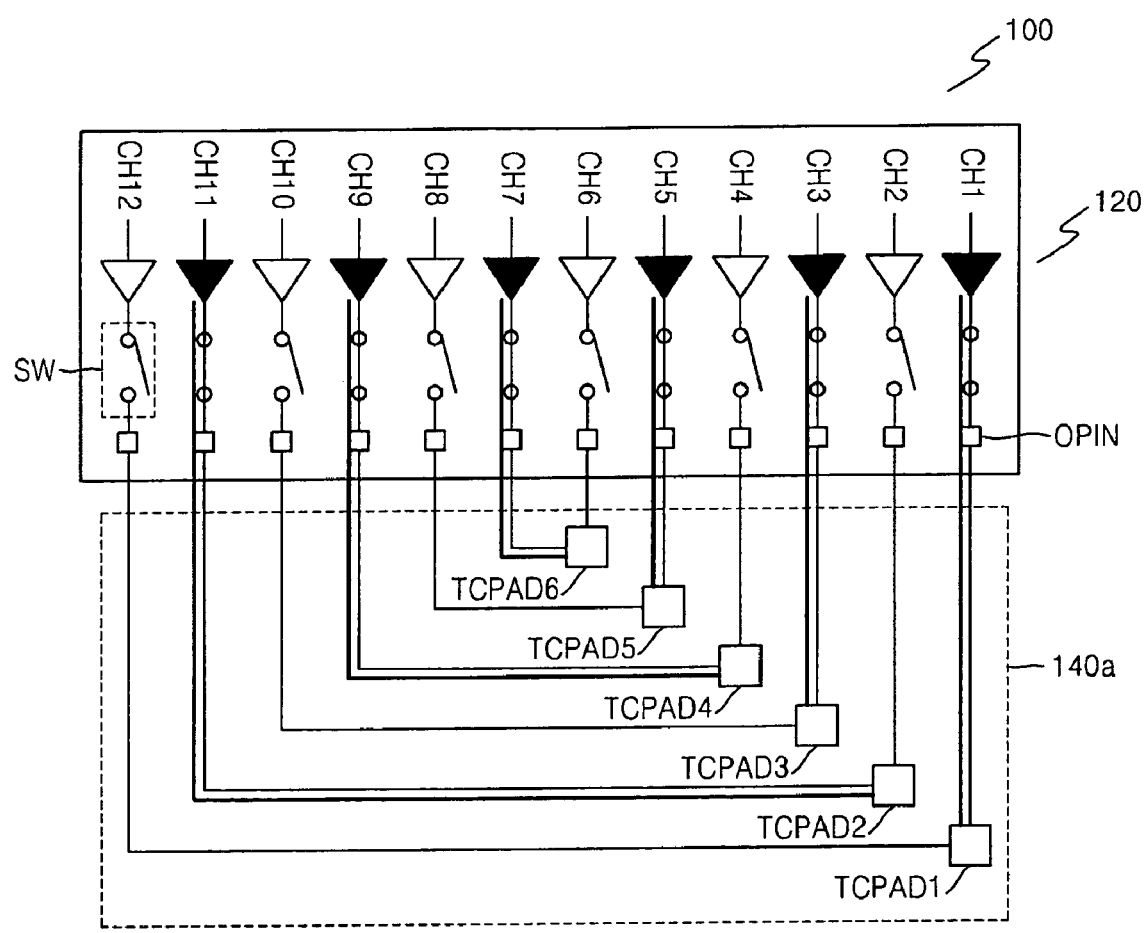
FIGS. 6A and 6B illustrate output paths of test signals in the film-type semiconductor package including the test pad unit of FIG. 4.
Figure 6B:
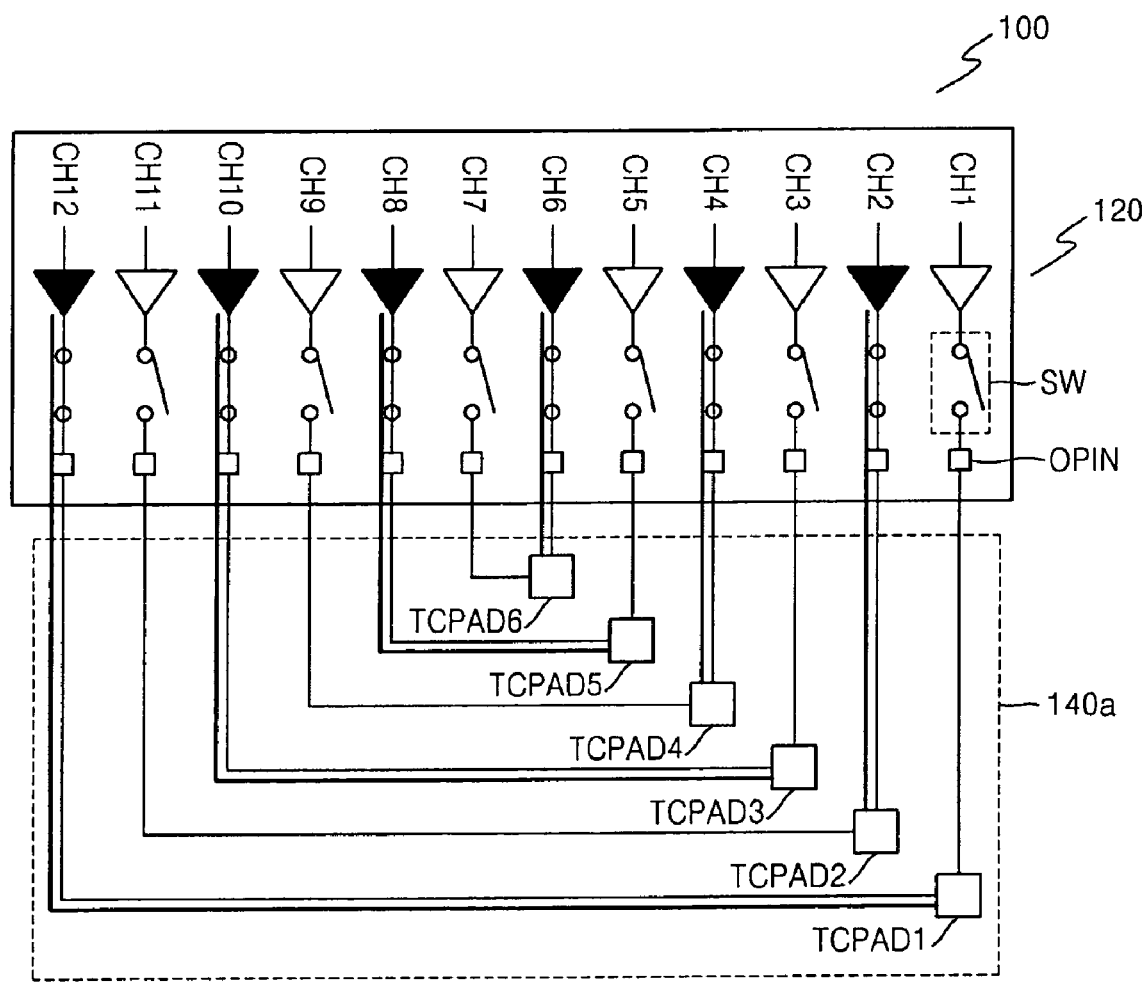

FIGS. 6A and 6B illustrate output paths of test signals in the film-type semiconductor package 100 including the test pad unit 140. Referring to FIGS. 6A and 6B, when one of two output channels that share a common pad TCPADk is activated as indicated by a bold line, a test signal corresponding to the activated output channel is output to the test device 200 of FIG. 4 (an output line is not shown). In this case, the other output channel is deactivated.

When each of the common pads TCPAD1 through TCPADk is shared by two output channels CHi and CHj, the output unit 120 may activate odd numbered output channels first. That is, the output unit 120 may activate the first, third, fifth, seventh, ninth, and eleventh output channels CH1, CH3, CH5, CH7, CH9, and CH11 (bold lines) as illustrated in FIG. 6A. Then, the output unit 120 outputs the test signals (not shown) respectively corresponding to the activated odd numbered output channels, that is, the first, third, fifth, seventh, ninth, and eleventh output channels CH1, CH3, CH5, CH7, CH9 and CH11. Next, the output unit 120 activates even numbered output channels, that is, the second, fourth, sixth, eighth, tenth, and twelfth output channels CH2, CH4, CH6, CH8, CH10, and CH12 (bold lines) as illustrated in FIG. 6B. Then, the output unit 120 outputs the test signals (not shown) respectively corresponding to the activated even numbered output channels, that is, the second, fifth, sixth, eighth, tenth, and twelfth output channels CH2, CH4, CH6, CH8, CH10 and CH12.

The output unit 120 includes a plurality of switches SW which activate the first through twelfth output channels CH1 through CH12, respectively. A control circuit (not shown) may perform a switching operation.

Since one of the two output channels CHi and CHj that share one of the common pads TCPAD1 through TCPADk is activated at a time, even when the number of the output pins OPIN included in the film-type semiconductor package 100 is less than the number of test pins and input terminals included in the test device 200, the test device 200 can test the film-type semiconductor package 100.

Whether to activate next output channels after test signals corresponding to currently activated output channels are generated or after the film-type semiconductor package 100 is tested using the generated test signals depends on a test device. The output unit 120 of FIG. 5 may activate the even numbered output channels before the odd numbered output channels.

Figure 7:
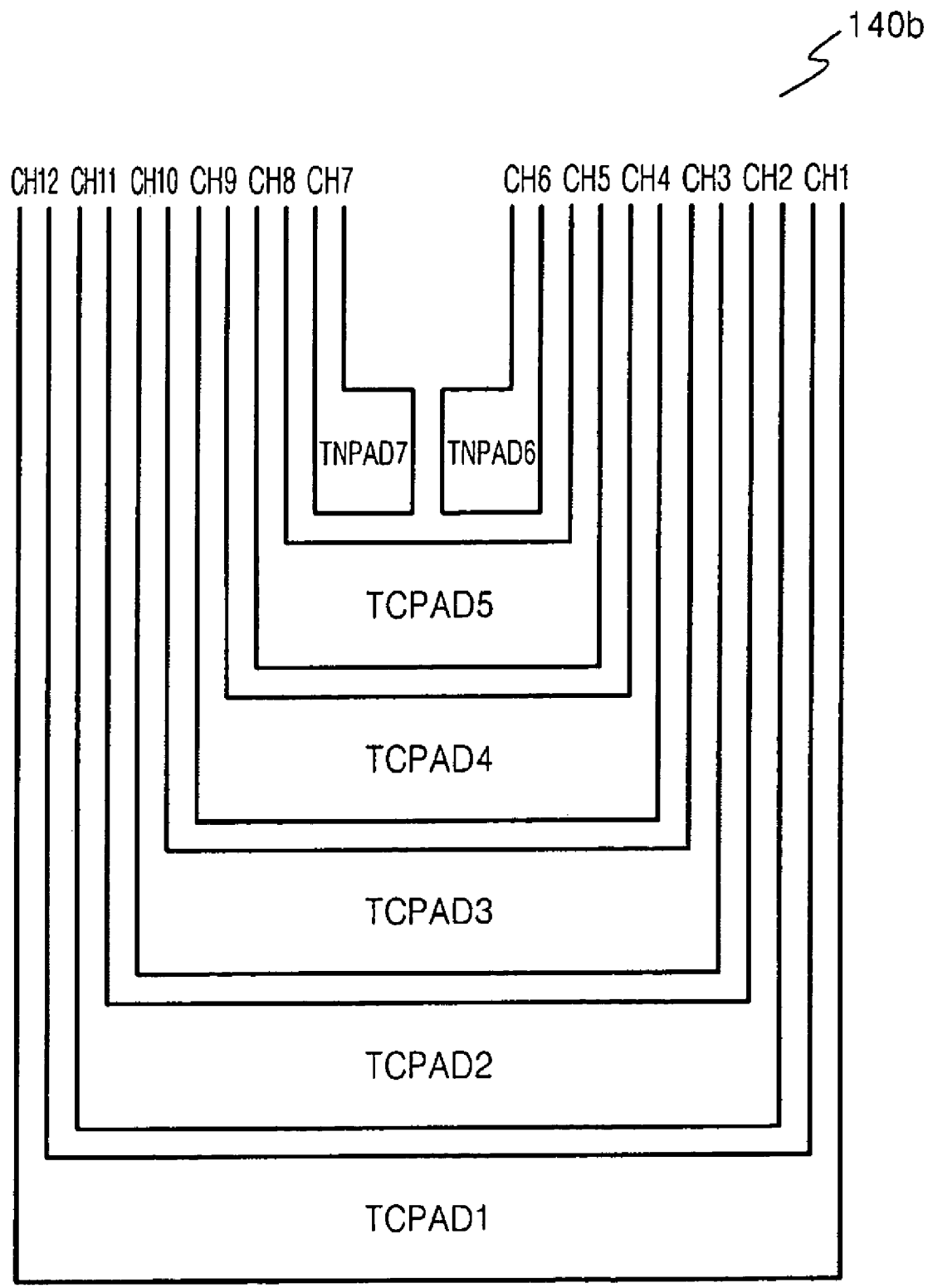
FIG. 7 illustrates a part of the test pad unit of the film-type semiconductor package according to another embodiment of the present invention.

FIG. 7 illustrates a part of the test pad unit 140 of the film-type semiconductor package 100 according to another embodiment of the present invention. Referring to FIG. 7, a test pad unit 140b may further include a plurality of normal pads TNPADq through TNPADr (q and r are natural numbers smaller than n) which are respectively connected to the output channels CH1 through CHk and transmit corresponding test signals to an external device.

As in the test pad unit 140a of FIG. 5, each of the common pads TCPAD1 through TCPADk in the test pad unit 140b is shared by a pair of corresponding output channels CHi and CHj. However, in FIG. 7, normal pads TNPAD6 and TNPAD7 respectively correspond to a sixth channel CH6 (n/2=6) and a seventh channel CH7 ((n/2)+1=7).

The test pad unit 140b includes the common pads TCPAD1 through TCPADk identical to those of the test pad unit 140a of FIG. 5. The normal pads TNPAD6 and TNPAD7 included in the test pad 140b are not shared. Thus, the contact between test pads can be evaluated.

Figure 8A:
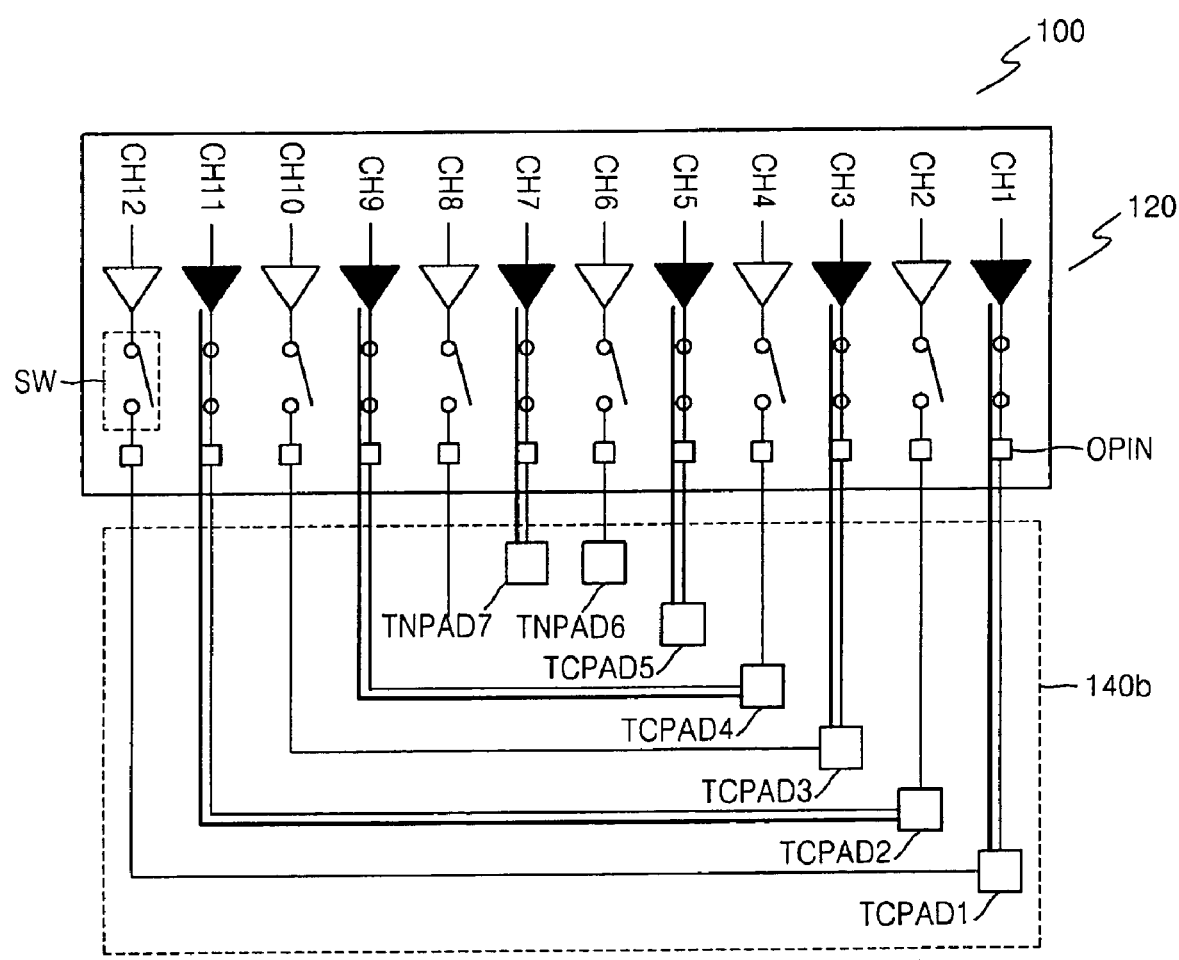
FIGS. 8A and 8B illustrate output paths of test signals in the film-type semiconductor package including the test pad unit of FIG. 7.
Figure 8B:
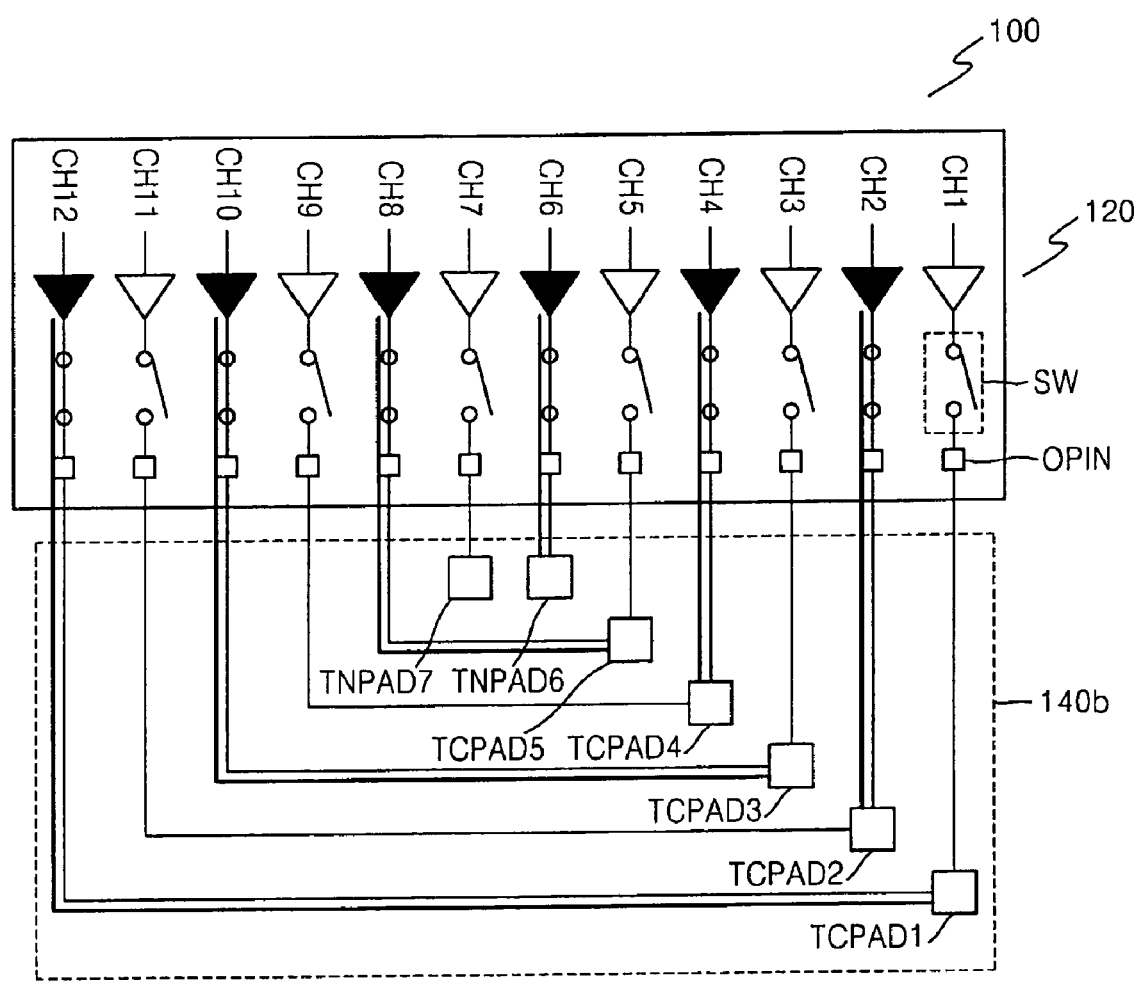

FIGS. 8A and 8B illustrate output paths of test signals in the film-type semiconductor package 100 including the test pad unit 140b of FIG. 7. Referring to FIGS. 8A and 8B, the test pad unit 140b activates odd numbered output channels (bold lines in FIG. 8A), outputs test signals corresponding to the activated odd numbered output channels, and then activates even numbered output channels (bold lines in FIG. 8B). Although the normal pads TNPAD6 and TNPAD7 are included, the operation of the output unit 120 included in the film-type semiconductor package 100 does not change.

That is, a change in the configuration of the test pad unit 140 does not affect other parts of the film-type semiconductor package 100. All that is required is a change in a control mechanism for activating the output channels of the output unit 120.

FIG. 9 is a flowchart illustrating a method 300 of testing a film-type semiconductor according to an embodiment of the present invention. Referring to FIG. 9, the method 300 is used to test a film-type semiconductor package including a plurality of common pads, each of which is shared by at least two of a plurality of output channels that transmit test signals to an external device. The method 300 includes activating one of the at least two output channels that share each of the common pads and outputting a test signal corresponding to the activated output channel while deactivating the remaining output channel (operation 310) and testing the film-type semiconductor package using the output test signal (operation 320).

The film-type semiconductor package includes a plurality of switches which respectively activate corresponding output channels. Here, at least two of the output channels share each of the common pads.

The method 300 of testing a film-type semiconductor package is applicable to the film-type semiconductor package 100 described above. Therefore, those of ordinary skill in the art could understand the method 300 of testing a film-type semiconductor package based on the above description of the film-type semiconductor package 100.

A film-type semiconductor package including test pads, each of which is shared by output channels, and a method of testing the film-type semiconductor package have been described above. In addition, a method of testing a film-type semiconductor package using a conventional test device even when the number of output pins included in the film-type semiconductor package is greater than the number of test pins included in the conventional test device has been described. Hereinafter, a test device, a semiconductor device, and a method using a printed circuit board (PCB) having patterns shared by test channels will be described.

Figure 10:
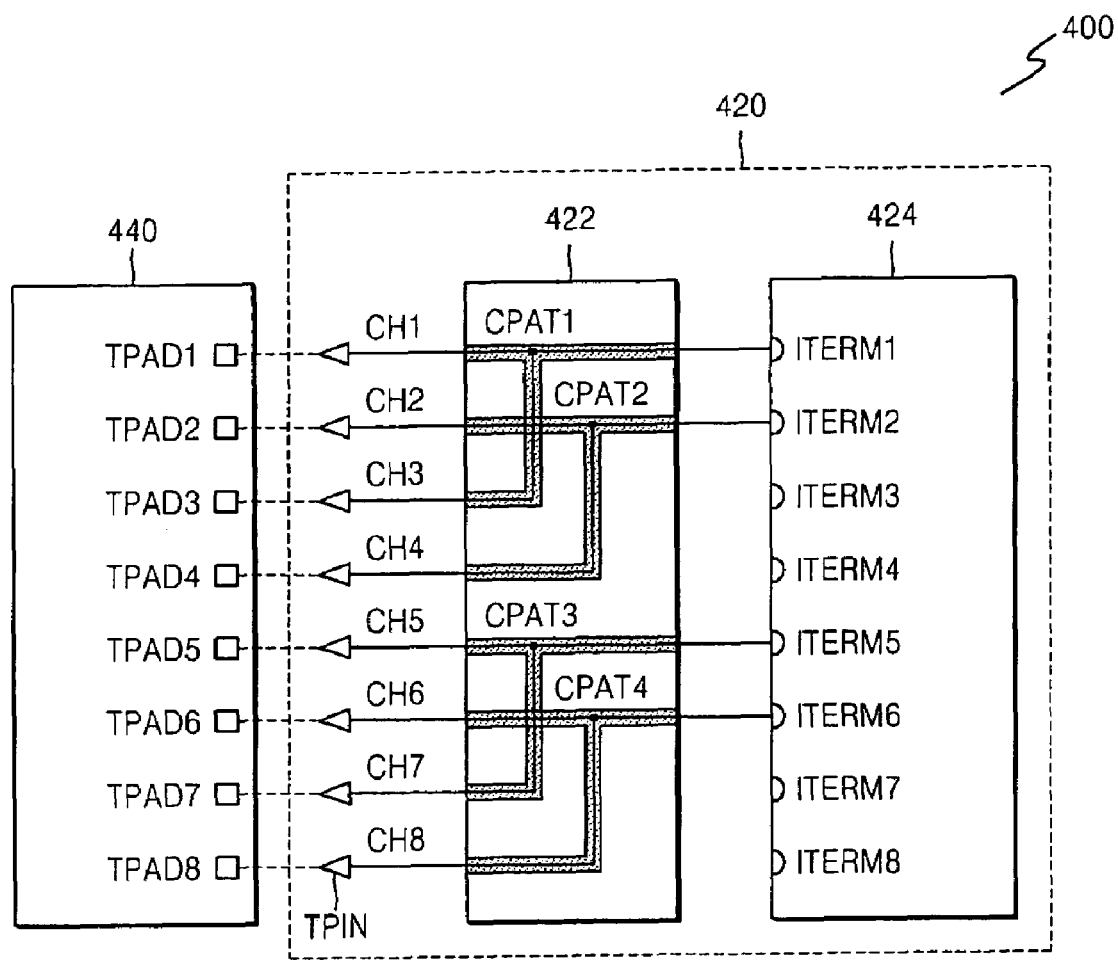
FIG. 10 is a block diagram of a semiconductor device according to an embodiment of the present invention.

FIG. 10 illustrates a semiconductor device 400 according to an embodiment of the present invention. Referring to FIG. 10, the semiconductor device 400 includes a film-type semiconductor package 440 and a test device 420. The semiconductor device 400 illustrated in FIG. 10 includes first through eighth test channels CH1 through CH8.

The film-type semiconductor package 440 outputs test signals through first through eighth test pads TPAD1 through TPAD8. The test device 420 includes a plurality of test pins TPIN, a tester head 424, and a PCB 422.

The test pins TPIN contact the first through eighth test pads TPAD1 through TPAD8, and thus receive the test signals. The test pins TPIN respectively correspond to the first through eighth test pads TPAD1 through TPAD8.

The PCB 422 receives the test signals from the test pins TPIN and transmits the received test signals to the tester head 424. The PCB 422 includes first through fourth common conductive patterns CPAT1 through CPAT4. A plurality of input terminals ITERM1 through ITERMk are shared through the first through fourth common patterns CPAT1 through CPAT4 by at least two test channels CHi and CHj among the first through eighth test channels CH1 through CH8 that respectively connect the first through eighth input terminals ITERM1 through ITERM 8 to the test pins TPIN.

In FIG. 10, the PCB 422 includes the first and third common patterns CPAT1 and CPAT3 patterned such that pairs of odd numbered test channels adjacent to each other, that is, the first and third test channels CH1 and CH3 and the fifth and seventh test channels CH5 and CH7, share common input terminals, that is, the first and fifth input terminals ITERM1 and ITERM5, respectively. The PCB 422 also includes the second and fourth common patterns CPAT2 and CPAT4 patterned such that pairs of even numbered test channels adjacent to each other, that is, the second and fourth test channels CH2 and CH4 and the sixth and eighth test channels CH6 and CH8, share common input terminals, that is, the second and sixth input terminals ITERM2 and ITERM6, respectively.

Figure 11A:
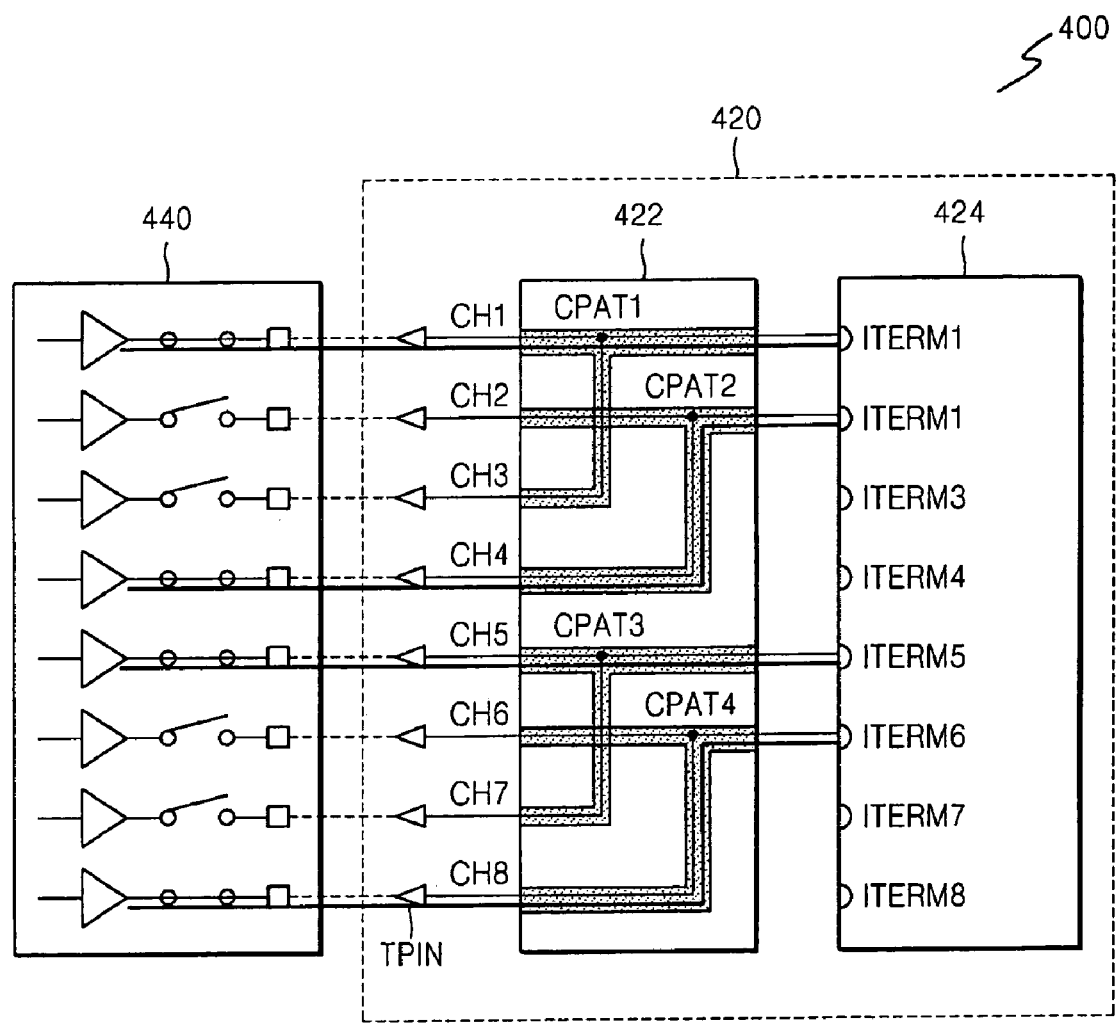
FIGS. 11A and 11B illustrate output paths of test signals in the semiconductor device of FIG. 10.
Figure 11B:
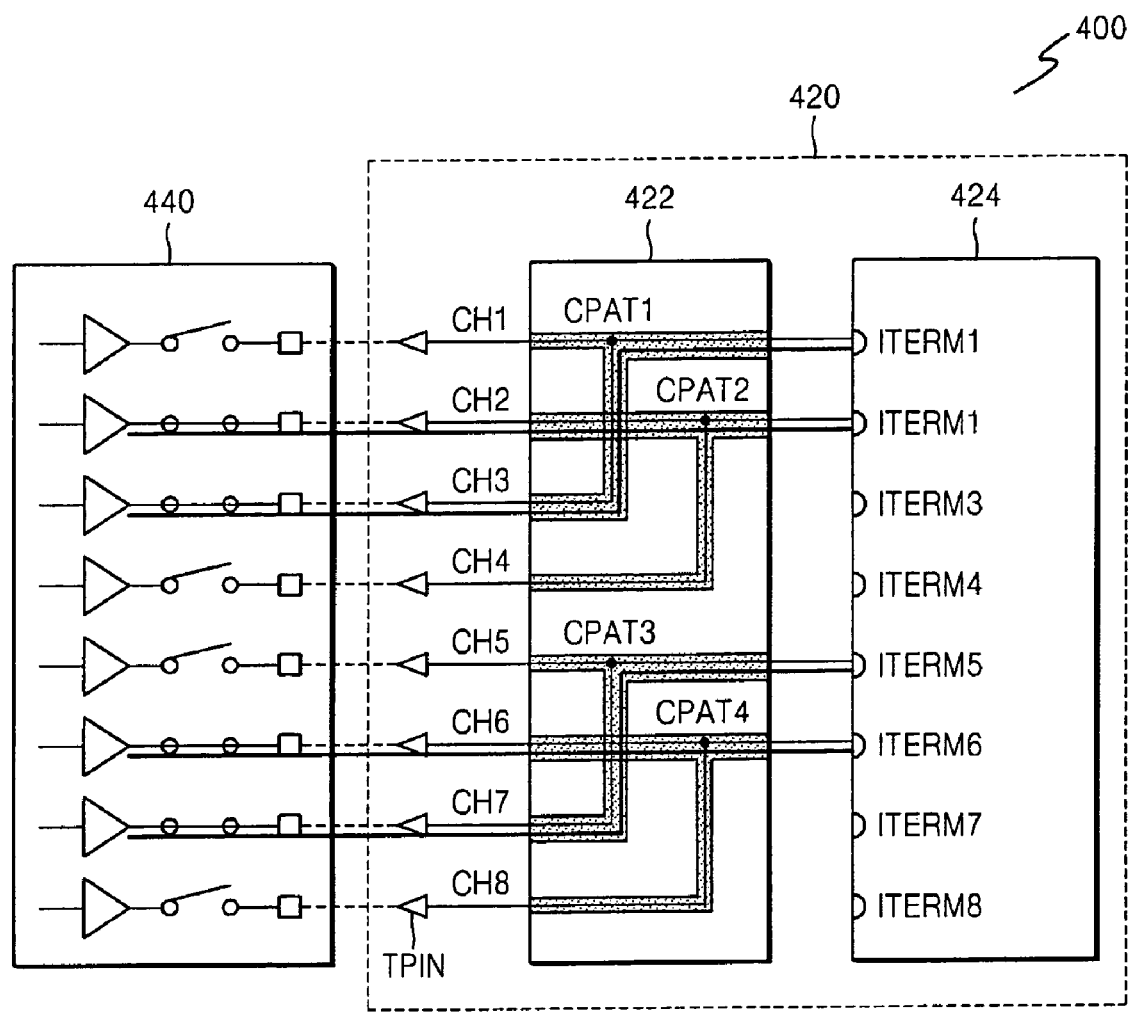

FIGS. 11A and 11B illustrate output paths of the test signals in the semiconductor device 400 of FIG. 10. Referring to FIGS. 10, 11A and 11B, while one of a pair of test channels CHi and CHj that share one of the input terminals ITERM1 through ITERMk via a common pattern CPATk is activated (bold line), the remaining one of the test channels CHi and CHj is deactivated. The film-type semiconductor package 440 outputs the test signals corresponding to the activated test channels (bold lines).

The semiconductor device 400 may activate test channels indicated by bold lines in FIG. 11A before test channels indicated by bold lines in FIG. 11B. The film-type semiconductor package 440 includes a plurality of switches for activating the first through eighth test channels CH1 through CH8, respectively.

The tester head 424 tests the film-type semiconductor package 440 using the test signals transmitted to the first through eighth input terminals ITERM1 through ITERM8 via the activated test channels (bold lines). The number of input terminals included in the tester head 424 may be less than n/2. Therefore, the tester head 424 may include only four input terminals since n is eight in FIG. 10.

Since, at a given time, the semiconductor device 400 activates only one of two test channels CHi and CHj that share one of the input terminals ITERM1 through ITERMk, even when the number of output pins included in the film-type semiconductor package 440 is smaller than the number of input terminals ITERM1 through ITERMk included in the test device 420, the test device 420 can test the film-type semiconductor package 440.

When the PCB 422 includes a plurality of layers, the first through eighth test channels CH1 through CH8 can be patterned in different layers. Therefore, the test device 420 can test the film-type semiconductor package 440 in a more stable manner.

Whether to activate subsequent test channels after test signals corresponding to activated test channels are generated or after the film-type semiconductor package 440 is tested using the generated test signals depends on a test device. The semiconductor device 400 may activate the test channels indicated by the bold lines in FIG. 11B before the test channels indicated by the bold lines in FIG. 11A.

Figure 12:
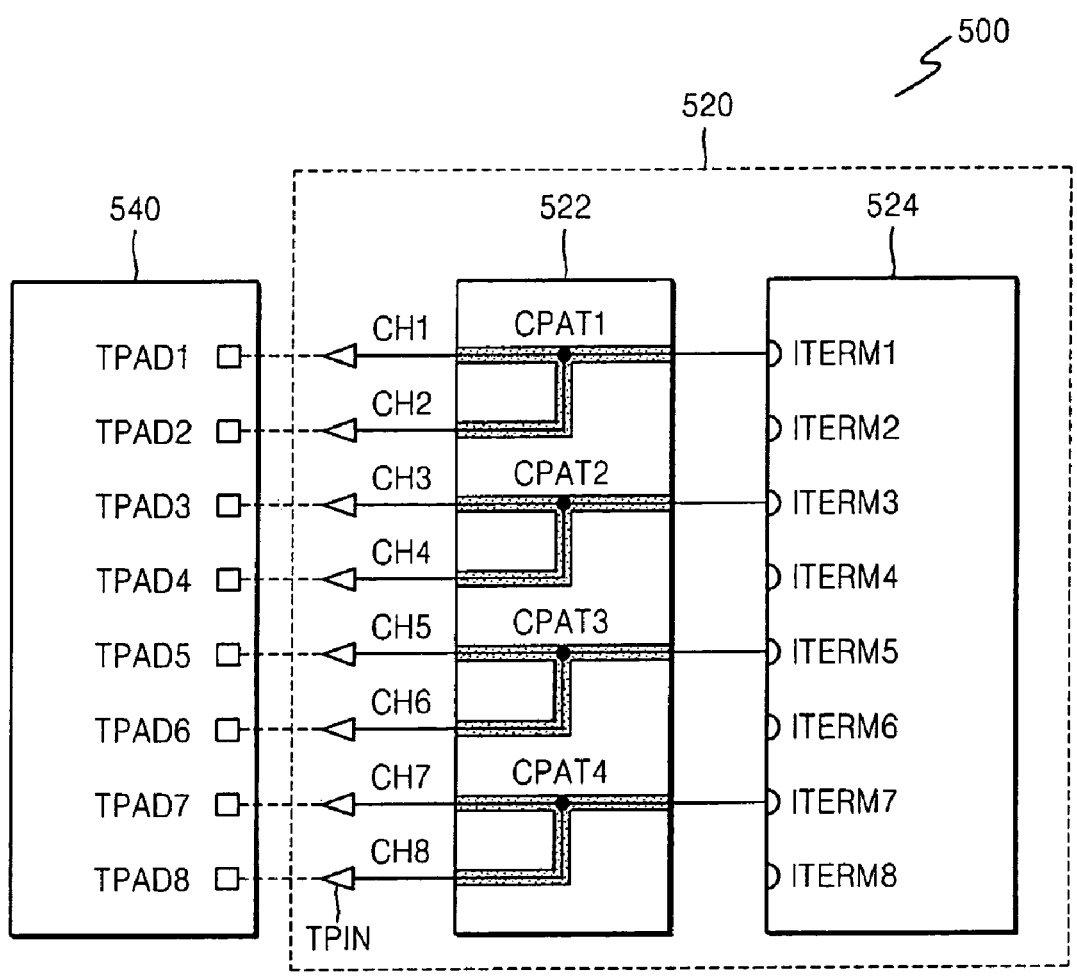
FIG. 12 is a block diagram of a semiconductor device according to another embodiment of the present invention.

FIG. 12 is a block diagram of a semiconductor device 500 according to another embodiment of the present invention. Referring to FIG. 12, first through fourth conductive common patterns CPAT1 through CPAT4 are identical to the first through fourth common patterns CPAT1 through CPAT4 illustrated in FIG. 10 except that different test channels share the first through fourth common patterns CPAT1 through CPAT4 of the semiconductor device 500. That is, the first through fourth common patterns CPAT1 through CPAT4 are patterned such that pairs of test channels adjacent to each other, that is, first and second test channels CH1 and CH2, third and fourth test channels CH3 and CH4, fifth and sixth test channels CH5 and CH6, and seventh and eighth test channels CH7 and CH8 share first, third, fifth, and seventh input terminals ITERM1, ITERM3, ITERM5 and ITERM7, respectively.

Figure 13A:
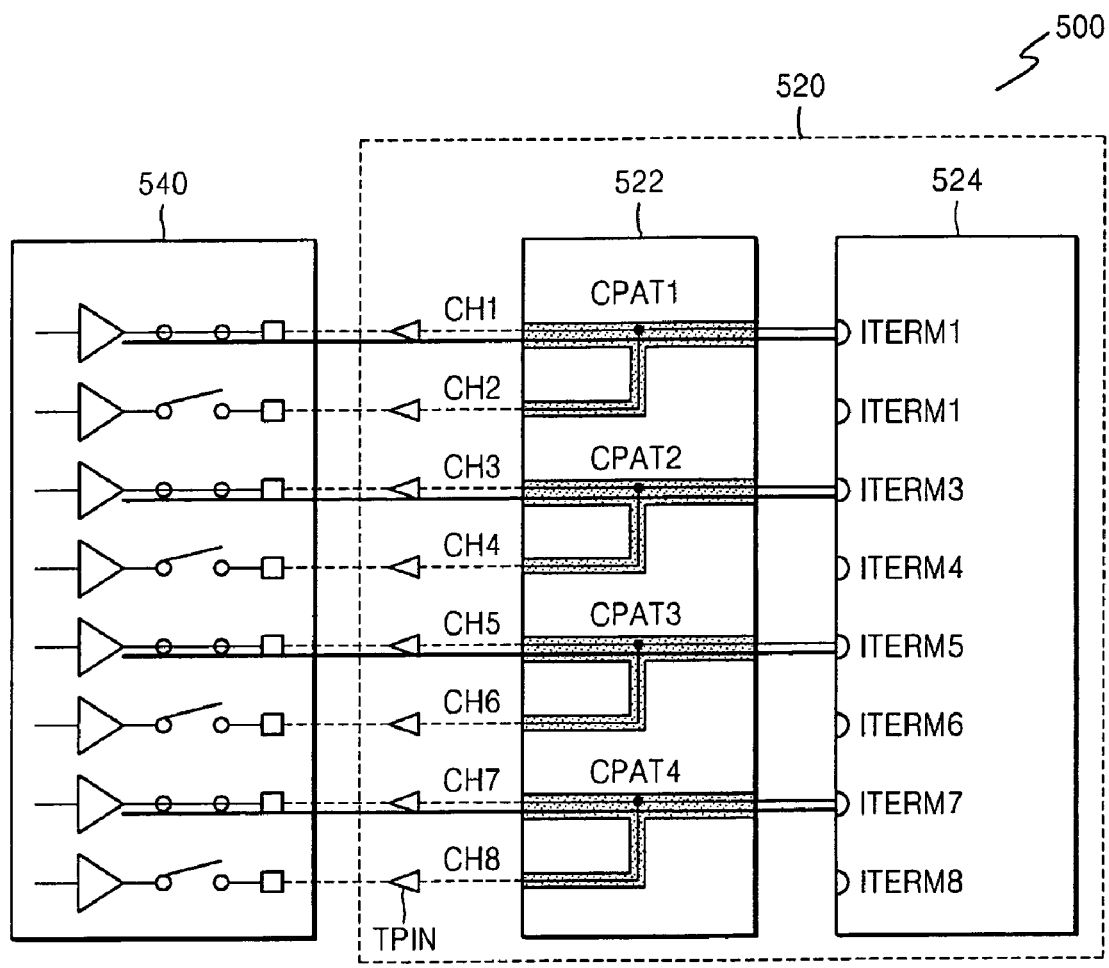
FIGS. 13A and 13B illustrate output paths of test signals in the semiconductor device of FIG. 12.
Figure 13B:
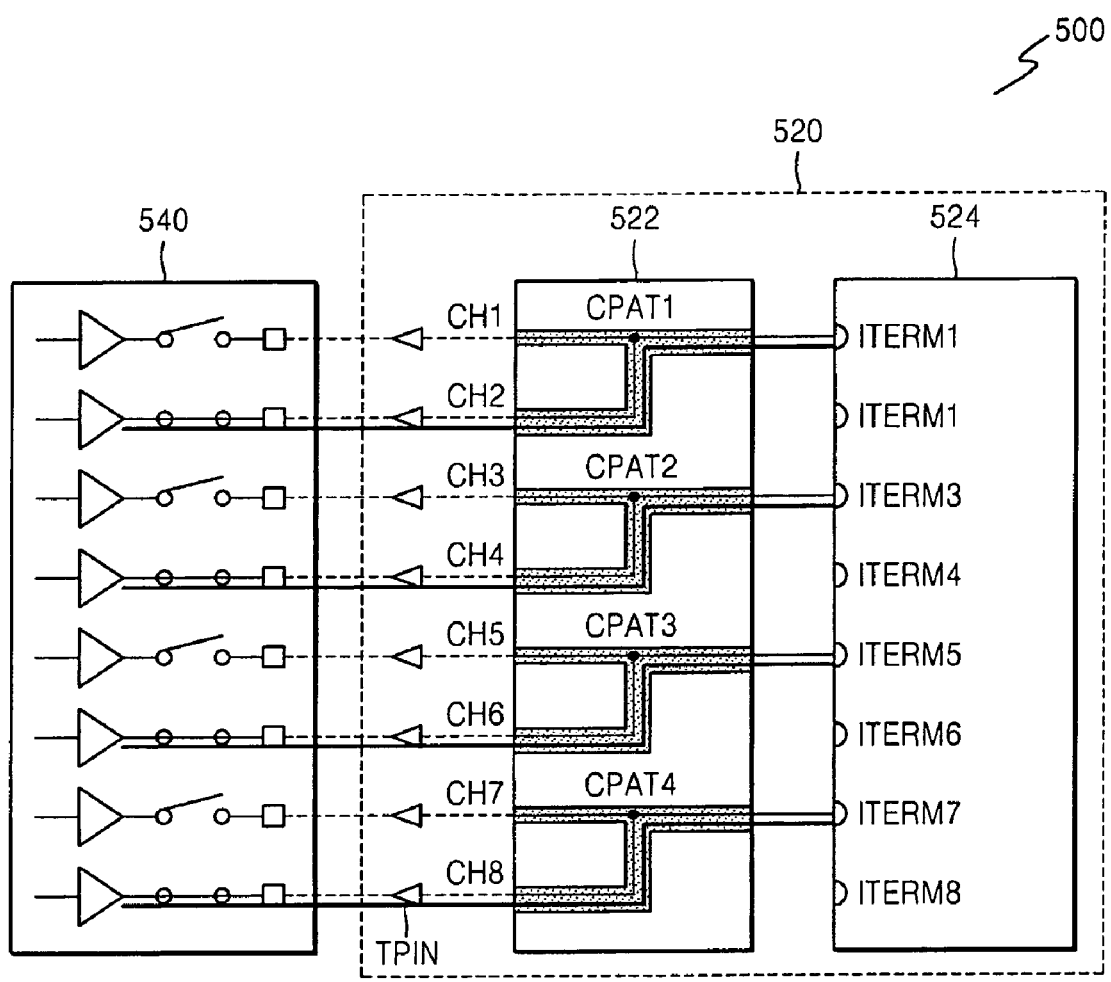

FIGS. 13A and 13B illustrate output paths of the test signals in the semiconductor device 500 of FIG. 12. Referring to FIGS. 13A and 13B, like the semiconductor device 400 of FIGS. 11A and 11B, the semiconductor device 500 activates (bold line) one of a pair of test channels CHi and CHj that share one of the input terminals ITERM1 through ITERMk through a common pattern CPATk while deactivating the other test channels CHi or CHj. A film-type semiconductor package 540 outputs the test signals corresponding to activated test channels (bold lines) to a test device 520.

In the semiconductor devices 400 and 500 of FIGS. 10 and 12, the test pins TPIN respectively correspond to the first through eighth test pads TPAD1 through TPAD8 included in the film-type semiconductor packages 440 and 540. Therefore, when the number of the test pins TPIN included in the film-type semiconductor packages 440 and 540 increases, the PCBs 422 and 522 must be replaced. The costs of replacing the PCBs 422 and 522 are not as high as the costs of replacing the tester heads 424 and 524.

FIG. 14 is a flowchart illustrating a method 600 of testing a film-type semiconductor package in a semiconductor device according to an embodiment of the present invention. Referring to FIG. 14, the method 600 is used to test a film-type semiconductor package of a semiconductor device including the film-type semiconductor package and a test device. The test device includes a plurality of conductive common patterns, each of which is shared by at least two of a plurality of test channels that receive test signals from the film-type semiconductor package. The method 600 includes activating one of the at least two test channels that share each of the common patterns and outputting a test signal corresponding to the activated test channel while deactivating the remaining test channels (operation 610), and testing the film-type semiconductor package using the received test signal (operation 620).

The common patterns are patterned such that each pair of test channels share an input terminal. The film-type semiconductor package includes a plurality of switches which respectively activate corresponding test channels. When the PCB includes a plurality of layers, the common patterns are patterned such that test channels in a given layer can share a corresponding input terminal.

The method 600 of testing a film-type semiconductor package is applicable to the film-type semiconductor package 400 or 500 described above. Therefore, those of ordinary skill in the art can understand the method 600 of testing the film-type semiconductor package based on the above description of the film-type semiconductor package 400 or 500.

A film-type semiconductor package including test pads, each of which is shared by a plurality of output channels, a method of testing the film-type semiconductor package, a test device and a semiconductor device including patterns shared by test channels, and a method of testing a film-type semiconductor package in the semiconductor device have been described above. According to the method of testing the film-type semiconductor package, the output channels can share test pads or the test channels can share input terminals through the patterns formed in a PCB of a test device. Therefore, even when the number of test pins or input terminals included in the test device is smaller than the number of output pins included in the film-type semiconductor package, the test device can test the film-type semiconductor package.

In addition, since the output channels can share the test pads or the test channels can share the input terminals, at least two film-type semiconductor packages can be tested simultaneously.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A film-type semiconductor package comprising:
   an output unit outputting test signals through a plurality of output channels; and
   a test pad unit receiving the test signals and outputting the received test signals to an external test device,
   wherein the test pad unit comprises a plurality of common pads, each of which is shared by at least two of the output channels, and wherein one of the output channels sharing one common pad is activated at a time.

2. The semiconductor package of claim 1, wherein the output unit comprises a plurality of switches respectively activating the output channels.

3. The semiconductor package of claim 1, wherein, when a group of the output channels arranged in order are from first to $n^{th}$ output channels, wherein n is a multiple of 2, each of the common pads is shared by an $i^{th}$ channel and a $j^{th}$ channel, wherein i and j are natural numbers equal to or smaller than n, where i+j=n+1.

4. The semiconductor package of claim 1, wherein the test pad unit further comprises a plurality of normal pads respectively connected to the output channels which do not share the common pads one-to-one.

5. The semiconductor package of claim 4, wherein, when a group of the output channels arranged in order are from first to $n^{th}$ output channels, wherein n is a multiple of 2, each of the common pads is shared by an $i^{th}$ channel and a $j^{th}$ channel, wherein i and j are natural numbers equal to or smaller than n, where i+j=n+1, and each of the normal pads respectively connect a n/2-th output channel and a ((n/2)+1)-th output channel.

6. A method of testing a film-type semiconductor package comprising a plurality of common pads, each of which is shared by at least two output channels which transmit test signals to an external device, the method comprising:
   activating one of the at least two output channels which share each of the common pads and outputting a test signal corresponding to the activated output channel while deactivating the remaining output channels; and
   testing the film-type semiconductor package using the output test signals.

7. The method of claim 6, wherein the film-type semiconductor package comprises a plurality of switches respectively activating the output channels.

8. A method of testing a film-type semiconductor package in a semiconductor device which comprises the film-type semiconductor package and a test device testing the film-type semiconductor package, wherein the test device comprises a plurality of common patterns, each of the common patterns connects at least two test channels transmitting test signals from the film-type semiconductor package to an input terminal of the test device, the method comprising:
   activating one of the at least two test channels which are connected to each of the input terminals and receiving a test signal corresponding to the activated test channel while deactivating the remaining test channels; and
   testing the film-type semiconductor package using the received test signal.

9. The method of claim 8, wherein the film-type semiconductor package comprises a plurality of switches respectively activating the test channels.

10. The method of claim 8, wherein the common patterns are patterned on a PCB comprised of the test device, when the PCB has a plurality of layers, the test channels in different layers of the PCB share one of the input terminals.

* * * * *